(12) United States Patent
Ashizawa (10) Patent No.: US 8,794,896 B2
(45) Date of Patent: Aug. 5, 2014

(54) VACUUM PROCESSING APPARATUS AND ZONAL AIRFLOW GENERATING UNIT

(75) Inventor: Kengo Ashizawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1552 days.

(21) Appl. No.: 11/513,255

(22) Filed: Aug. 31, 2006

(65) Prior Publication Data

US 2007/0130738 A1 Jun. 14, 2007

Related U.S. Application Data (60) Provisional application No. 60/777,546, filed on Mar. 1, 2006.

(30) Foreign Application Priority Data

Dec. 14, 2005 (JP) .................................. 2005-360781

(51) Int. Cl.
*H01L 21/00* (2006.01)

(52) U.S. Cl.
USPC ...... 414/217; 118/719; 118/733; 156/345.31; 156/345.32

(58) Field of Classification Search
USPC .......... 118/719; 156/345.31, 345.32; 414/217, 414/217.1, 935–941
See application file for complete search history.

(56) References Cited

U.S. PATENT DOCUMENTS

| | | | |
|---|---|---|---|
| 3,785,853 A | * | 1/1974 | Kirkman et al. .......... 427/255.23 |
| 5,752,796 A | * | 5/1998 | Muka .......................... 414/217.1 |
| 6,244,811 B1 | * | 6/2001 | Kroeker et al. ............... 414/217 |
| 6,364,762 B1 | * | 4/2002 | Kaveh et al. ................... 454/187 |
| 6,440,320 B1 | * | 8/2002 | Shinozaki ........................ 216/90 |
| 6,543,981 B1 | * | 4/2003 | Halsey et al. ............... 414/217.1 |
| 6,638,672 B2 | * | 10/2003 | Deguchi ........................... 430/30 |
| 2004/0050321 A1 | * | 3/2004 | Kitano et al. .................. 118/300 |
| 2006/0018736 A1 | * | 1/2006 | Lee et al. ....................... 414/217 |

FOREIGN PATENT DOCUMENTS

| | | | |
|---|---|---|---|
| JP | 62087749 A | * | 4/1987 |
| JP | 63-100827 | | 6/1988 |
| JP | 2-45920 | | 2/1990 |
| JP | 3-87386 | | 4/1991 |
| JP | 05275382 A | * | 10/1993 |
| JP | 2003-7799 | | 1/2003 |
| JP | 2003-115519 | | 4/2003 |
| JP | 2005039265 A | * | 2/2005 |

* cited by examiner

*Primary Examiner* — Karla Moore
(74) *Attorney, Agent, or Firm* — Rothwell, Figg, Ernst & Manbeck, P.C.

(57) ABSTRACT

A vacuum processing apparatus includes a vacuum processing chamber; a load lock chamber connected to the vacuum processing chamber via a gate valve or via a gate valve and a depressurized space and also connected to an atmospheric space via a door valve, an interior atmosphere of the load lock chamber being changed between a substantially atmospheric state and a depressurized state; an air blowing portion, provided at a vicinity of the door valve in the atmospheric space, for blowing a zonal airflow vertically downward from a position substantially even with or higher than a top end of a passageway of the door valve; and an air suctioning portion for suctioning the airflow or the inert gas from the air blowing portion by a vacuum force at a position substantially even with or lower than a bottom end of the passageway of the door valve.

13 Claims, 4 Drawing Sheets

VACUUM PROCESSING APPARATUS AND ZONAL AIRFLOW GENERATING UNIT

FIELD OF THE INVENTION

The present invention relates to a vacuum processing apparatus for performing a desired processing on an object to be processed in a vacuum processing chamber; and, more particularly, to a vacuum processing apparatus having a load lock chamber capable of being in communication with a vacuum processing chamber in a depressurized atmosphere.

BACKGROUND OF THE INVENTION

In manufacturing of a semiconductor device or a flat panel display (FPD), various processes such as a film forming process, a heat treating process, a dry etching process, a cleaning process, and so forth are performed in a vacuum vessel (vacuum chamber) in presence of processing gases. To load or unload an object to be processed (for example, a semiconductor wafer, a glass substrate, etc.) into or from the vacuum vessel or the vacuum chamber without exposing it to the normal atmospheric environment, a load lock chamber whose atmosphere can be selectively changed into an atmospheric state or a depressurized state is connected to the vacuum chamber via a gate valve or via a gate valve and a vacuum transfer chamber (see, for example, Japanese Patent Laid-open Application No. H3-87386).

In general, the load lock chamber is connected to an atmospheric space via a door valve located opposite to a gate valve. After turning the load lock chamber into an atmospheric state, the door valve is opened to allow the load lock chamber to be exposed to the normal atmospheric environment. While the door valve is opened, an atmospheric transfer robot provided outside the load lock chamber loads an object to be processed into the load lock chamber and later unloads the processed object from the load lock chamber by using a transfer arm which is movable in forward and backward directions.

As mentioned above, the door valve is opened after the load lock chamber is turned into the atmospheric state. Here, to prevent external air from entering the load lock chamber, a pressure control may be executed by supplying a purge gas such as a nitrogen gas into the load lock chamber to thereby control the internal pressure of the load lock chamber at a pressure level slightly higher than an atmospheric pressure (i.e., a positive pressure). Despite the pressure control, however, it frequently happens that outside air enters the load lock chamber through the opened door valve when the transfer arm or the object is loaded or unloaded into or from the load lock chamber or due to external causes. In such a case, foreign substances including water molecules in the outside air as well as other particles therein may enter the load lock chamber. Those water molecules entering the load lock chamber usually end up being attached to the surface of the object to be processed, which, in turn will reduce the production yield thereof. Moreover, when loading the object to be processed, the presence of water molecules may cause an increase in processing time for a subsequent vacuum evacuation step, and when unloading the processed object, the water molecules may react with residual gas molecules stuck on or floating near the processed object, resulting in a generation of a noxious substance and/or an undesired reaction product. Meanwhile, when the door valve is opened after setting the internal pressure of the load lock chamber as a positive pressure, residual gas molecules floating in the load lock chamber would diffuse out to outside environment, which is not preferable in terms of protecting the environment. Here, the residual gas molecules may include un-reacted processing gas molecules stuck to the object in the vacuum processing chamber, reaction by-product gas molecules, gas molecules released as reaction products on the surface of the object, and so forth.

Moreover, conventionally, attempts have been made to install an air shower near an atmospheric side of the door valve (above the door valve) to shot a clean airflow downward to thereby blow out foreign substances attached on the surface of the object passing through a passageway of the door valve in an opened state. However, in case of using the air shower, the foreign substances removed from the surface of the object would be dispersed all around, i.e., into the load lock chamber or in the atmosphere. As a result, water molecules might enter the load lock chamber or the residual gas molecules might diffuse to the atmosphere, causing the same problems as mentioned above. Besides, the mechanism using the air shower has a limit in that it cannot remove foreign substances from a bottom surface of the object where the air stream is incapable of reaching, though it is possible to remove foreign substances from a top surface of the object exposed to the air stream.

SUMMARY OF THE INVENTION

It is, therefore, a primary object of the present invention to provide a vacuum processing apparatus capable of effectively preventing external air from entering a load lock chamber when a door valve is opened, while concurrently preventing the atmosphere in the load lock chamber from diffusing out to the outside environment, and also capable of effectively removing foreign substances attached on not only a top surface but also on a bottom surface of a target object passing through a passageway of the door valve when it is in an opened state.

Further, it is another object of the present invention to provide a zonal airflow generating unit having improved capabilities in: partitioning an object transfer passageway by airflow and removing foreign substances from surfaces of a target object.

To solve these objects, a vacuum processing apparatus in accordance with the present invention includes: a vacuum processing chamber in which a predetermined processing is performed on a target object under a depressurized pressure; a load lock chamber connected to the vacuum processing chamber via a gate valve or via a gate valve and a preset depressurized space and also connected to an atmospheric space via a door valve, an interior atmosphere of the load lock chamber being changed between a substantially atmospheric state and a depressurized state to perform a transfer of the target object between the vacuum processing chamber and the atmospheric space; an air blowing portion, provided at a vicinity of the door valve in the atmospheric space, for blowing a zonal airflow or an inert gas vertically downward from a position substantially even with or higher than a top end of a passageway of the door valve; and an air suctioning portion, provided substantially right below the air blowing portion in the atmospheric space, for suctioning the airflow or the inert gas from the air blowing portion by a vacuum force at a position substantially even with or lower than a bottom end of the passageway of the door valve.

In the above configuration, the zonal airflows or inert gas (e.g., nitrogen gas) blown downward from the air blowing portion are vertically drawn downward by the vacuum force of the air suctioning portion disposed right below the air blowing portion. If there is no obstacle on the way, the zonal laminar airflows are maintained until they reach the bottom of a passageway formed between the air blowing portion and the air suctioning portion without suffering from a generation of turbulent currents, whereby the passageway is vertically partitioned into two spaces. In this case, by increasing the vacuum force of the air suctioning portion slightly, ambient gas, i.e., air in the atmospheric space or a gas in the load lock chamber can also be suctioned by the air suctioning portion to be exhausted outside. Here, the gas in the load lock chamber is drawn to the air suctioning portion through a passageway of the door valve in an open state.

While the target object passes through the passageway between the air blowing portion and the air suctioning portion, the zonal downward airflows or the inert gas blown from the air blowing portion are made to contact the top surface of the target object, during which particles and/or water molecules attached on the top surface of the target object are blown off the object top surface by the impact of the air contact. The particles and/or water molecules blown off the target object are induced to the air suctioning portion located below while whirling around the outside (periphery) of the target object together with the flows of air, inert gas and/or ambient air to be finally suctioned by the air suctioning portion. At this time, since the vacuum force from the air suctioning portion reaches the bottom surface (backside surface) of the target object, particles and/or water molecules attached on the bottom surface of the target object can also be removed therefrom to be suctioned by the air suctioning portion.

Though the air blowing portion and the air suctioning portion can be configured to be operated all the time while vacuum processing apparatus is operated, it is preferable to set them to be only operated when necessary. In accordance with a first preferred embodiment of the present invention, the air blowing portion and the air suctioning portion start an air blowing operation and an air suctioning operation, respectively, immediately before the door valve is opened, and stop their operations immediately after the door valve is closed.

In accordance with the first preferred embodiment of the present invention, the air suctioning portion has an impeller rotatably installed at a suction opening thereof. The impeller rotates by an airflow introduced to the suctioning opening resulting from the vacuum force or a wind force of an inert gas or external air, thereby forming the suctioning airflow of a vortex above thereabove. Thus, the suctioning of the particles and/or water molecules blown off the target object can be facilitated, and the effect of removing foreign substances such as particles and water molecules from the bottom surface of the target object can be further enhanced. In accordance with the second preferred embodiment of the present invention, the air suctioning portion has a rotary blade installed at a suction opening thereof and an electric motor for rotating the rotary blade.

In accordance with the third preferred embodiment of the present invention, the air blowing portion has a filter and/or heater for purifying and/or heating the airflow or the inert gas.

Further, a zonal airflow generating unit includes: an air blowing portion, provided above a predetermined passageway through which a target object is moved horizontally, for blowing a zonal airflow or an inert gas downward substantially vertically; and an air suctioning portion, provided below the passageway to face the air blowing portion, for suctioning the airflow or the inert gas by a vacuum force. With this zonal airflow generating unit, zonal airflows capable of maintaining the zonal laminar airflow until it reach the bottom of the passageway can also be generated between the air blowing portion and the air suctioning portion, while obtaining the same effects of partitioning the passageway by airflow and removal of foreign substances. Further, the location of the zonal airflow generating unit is not limited to the external vicinity of the door valve, but it can be installed in any passageway for the target object.

In accordance with the vacuum processing apparatus of the present invention, external air is effectively prevented from entering a load lock chamber when a door valve is opened, while the atmosphere in the load lock chamber is concurrently prevented from diffusing out to the outside environment, and also foreign substances attached on not only a top surface but also on a bottom surface of a target object passing through a passageway of the door valve are effectively removed when the door valve is in an opened state. The zonal airflow generating unit having improved capabilities in: partitioning an object transfer passageway by airflow and removing foreign substances from surfaces of a target object.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described with reference to the accompanying drawings.

Figure 1:
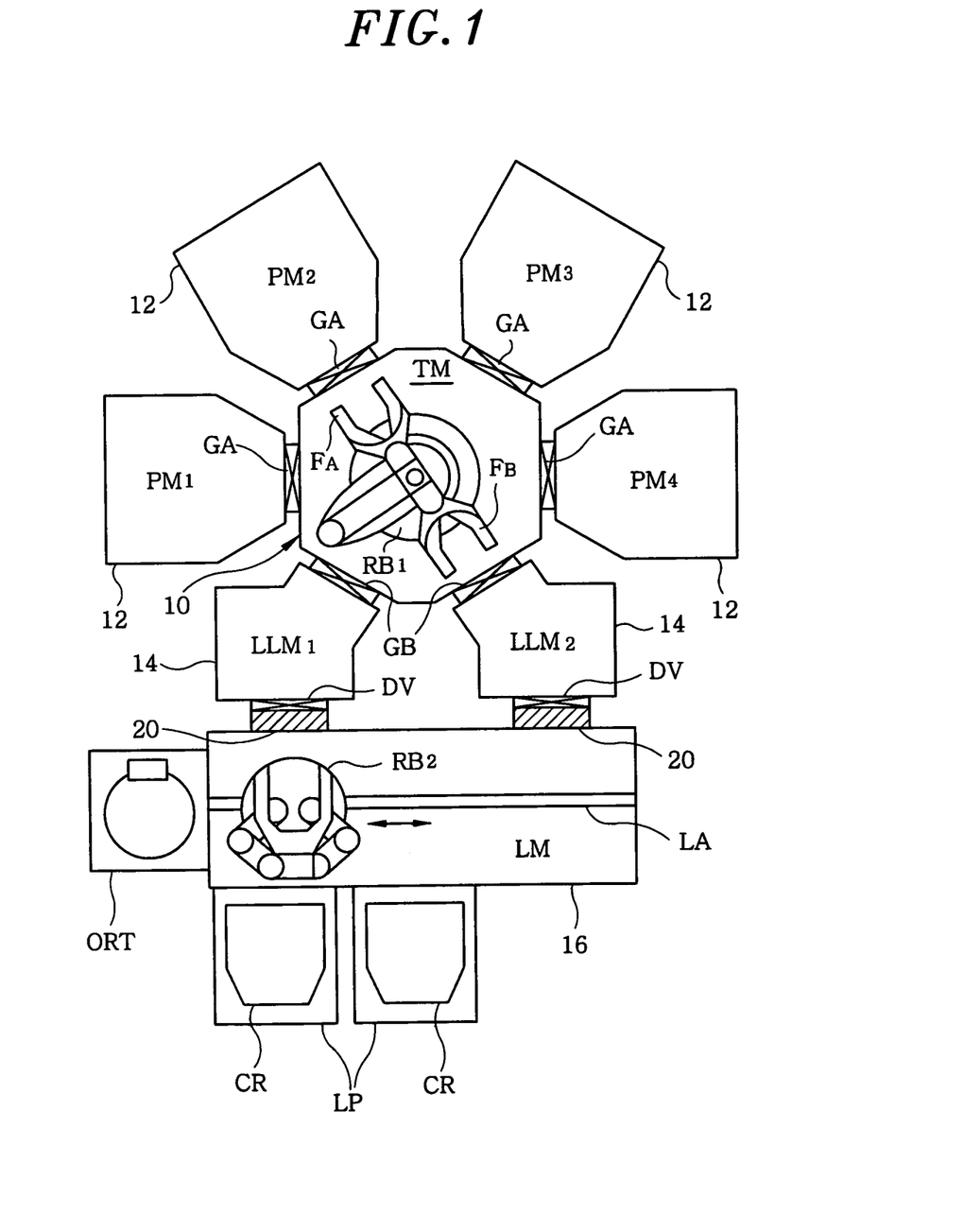
FIG. 1 is a plane view showing an overall configuration of a vacuum processing apparatus in accordance with a first preferred embodiment of the present invention.

Referring to FIG. 1, there is provided a plane view showing an overall configuration of a vacuum processing apparatus in accordance with a first preferred embodiment of the present invention. The vacuum processing apparatus is configured as a so-called cluster tool, which includes: a transfer module TM of, e.g., a hexagonal shape, having a vacuum transfer chamber 10 therein; a plurality of (e.g., four) process modules $PM_1$ to $PM_4$; and a pair load lock modules $LLM_1$ and $LLM_2$, wherein the process modules $PM_1$ to $PM_4$ and the load lock modules $LLM_1$ and $LLM_2$ are disposed around the transfer module TM in a cluster shape.

Each of the process modules $PM_1$ to $PM_4$ has a vacuum processing chamber 12 whose internal pressure is set and controlled independently. Further, each of the load lock modules $LLM_1$ and $LLM_2$ has a load lock chamber 14 whose atmosphere can be changed between an atmospheric state and a depressurized state, as will be described later. The vacuum processing chambers 12 of the process modules $PM_1$ to $PM_4$ are connected to the vacuum transfer chamber 10 of the transfer module TM via respective gate valves GA. Also, the load lock chambers 14 of the load lock modules $LLM_1$ and $LLM_2$ are connected to the vacuum transfer chamber 10 via respective gate valves GB. Further, inside the vacuum transfer chamber 10, there is installed a vacuum transfer robot $RB_1$ having a pair of transfer arms $F_A$ and $F_B$, which are extendible/contractible as well as revolving.

Within the vacuum processing chamber 12 of each of the process modules $PM_1$ to $PM_4$, a required single-sheet process, e.g., a film forming process such as a chemical vapor deposition (CVD), an atomic layer deposition (ALD) or a physical vapor deposition (PVD), a heat treating process, a semiconductor wafer surface cleaning process, a dry etching process, and so forth is performed by using required processing resources (a processing gas, a high frequency power, a heat, etc.)

Further, the atmosphere in the load lock chamber 14 of each of the load lock modules $LLM_1$ and $LLM_2$ can be changed between an atmospheric state and a depressurized state at a preset vacuum level. Each load lock chamber 14 is connected to an atmospheric transfer chamber 16 of a loader module LM via a door valve DV, the loader module being provided at an opposite side of the transfer module TM and being under an atmospheric pressure.

Load ports LP and an orientation flat alignment mechanism ORT are provided adjacent to the loader module LM. The load ports LP are used for loading and unloading of a wafer cassette CR for accommodating, e.g., a batch of 25 semiconductor wafers (hereinafter, simply referred to as "wafers") W between the vacuum processing apparatus and a cassette carrier. The orientation flat alignment mechanism ORT is used for the alignment of an orientation flat or a notch of a wafer W on a certain position or in a certain direction.

An atmospheric transfer robot $RB_2$ installed in the loader module LM has a pair of extendible/contractible transfer arms. The atmospheric transfer robot $RB_2$ is configured to be moved along a linear guide (linear slide) LA in a horizontal direction as well as it is capable of moving up and down and revolving. The atmospheric transfer robot $RB_2$ operates to travel between the load ports LP, the orientation flat alignment mechanism ORT and the load lock modules $LLM_1$ and $LLM_2$ to transfer wafers W therebetween sheet-by-sheet. Here, the atmospheric transfer robot $RB_2$ serves to load a wafer W into the loader module M when an LP door (not shown) provided at a front portion of a wafer cassette CR is opened. The linear guide LA is formed of, for example, a permanent magnet, a magnetic driving coil, a scale head, and so forth, and it executes a control of linear motions of the atmospheric transfer robot $RB_2$ in compliance with a command from a controller.

Below, there will be explained a basic wafer transfer mechanism for performing a transfer of a wafer W in the wafer cassette CR loaded in the load port LP, to subject the wafer W to a series of processes in the cluster tool.

The transfer robot $RB_2$ in the loader module LM takes a single wafer W out of the wafer cassette CR on the load port LP and carries the wafer W to the orientation flat alignment mechanism ORT, where the wafer W is subject to an orientation flat alignment. Thereafter, the transfer robot $RB_2$ moves the wafer W to either one of the load lock modules $LLM_1$ and $LLM_2$ (e.g., $LLM_1$). The load lock module $LLM_1$, receives the wafer W while it is under an atmospheric pressure. Then, upon receiving the wafer W, the load lock module $LLM_1$ is evacuated to a certain vacuum level, and it transfers the wafer W to the vacuum transfer robot $RB_1$, of the transfer module TM under a depressurized pressure.

The transfer robot $RB_1$, loads the wafer W taken out of the load lock module $LLM_1$, into a first process module (e.g., $PM_1$) by using either one of the transfer arms $F_A$ and $F_B$. The process module $PM_1$ executes a first single-sheet processing on the wafer W under a preset processing condition (gas, pressure, power, time, etc.) according to a predetermined processing recipe.

Upon the completion of the first single-sheet process, the transfer robot $RB_1$ takes out the wafer W from the first process module $PM_1$, and loads it into a second process module (e.g., $PM_2$). In the second process module, a second single-sheet process is performed under a preset processing condition according to a predetermined processing recipe.

Once the second single-sheet process has been completed, the transfer robot $RB_1$, unloads the wafer W from the second process module $PM_2$. Subsequently, if there remains another processing yet to be performed, the transfer robot $RB_1$, loads the wafer to a next process module (e.g., $PM_3$ or $PM_4$); and if there is no processing to be performed, the transfer robot $RB_1$, sends the wafer W back to either one of the load lock module $LLM_1$ and $LLM_2$. After the completion of the processing in a third process module, if there is any remaining processing to be performed, the wafer W is loaded into the next process module; and otherwise, the wafer W is returned to either one of the load lock module $LLM_1$ and $LLM_2$.

If the wafer W is loaded into one of the load lock modules (e.g., $LLM_2$) after undergoing a series of processes in the plurality of process modules $PM_1$ to $PM_4$ in the cluster tool, the interior of the load lock module $LLM_2$ is converted into an atmospheric state from a depressurized state. Thereafter, the transfer robot $RB_2$ of the loader module LM takes out the wafer W from the load lock module $LLM_2$ in the atmospheric state and returns the wafer W to the wafer cassette CR. Here, it is possible to perform a heating or a cooling process on the wafer W under a desired atmosphere during the stay of the wafer W in the load lock module $LLM_1$ or $LLM_2$.

As described, with this cluster tool, it is possible to transfer the wafer W between the process modules in a preset sequence while maintaining a vacuum to thereby perform a series of processes on the wafer W successively. Particularly, during a vacuum thin film forming process, by setting up the process modules to perform different film forming processes successively, desired thin films can be formed and laminated in-line. Furthermore, since each of the process modules repeats their single-sheet processes successively in accordance with a pipe line mechanism, high operating rate and productivity can be obtained.

In the cluster tool, a zonal airflow generating unit 20 in accordance with the first embodiment of the present invention is provided between the load lock module $LLM_1$, ($LLM_2$) and the loader module LM; and, more particularly, between the door valve DV and the atmospheric transfer chamber 16 of the loader module LM.

Figure 2:
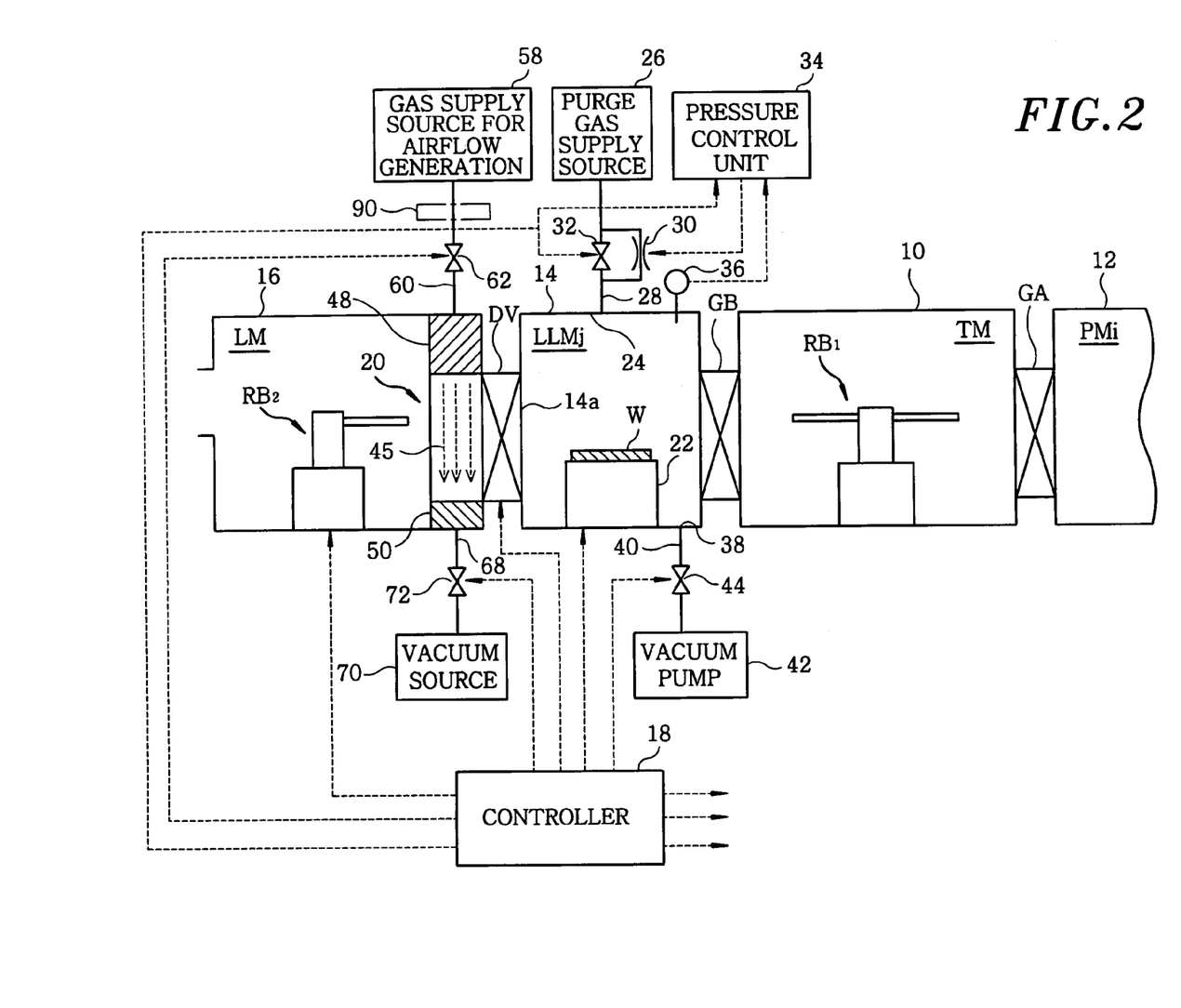
FIG. 2 sets forth a schematic side cross sectional view showing major components of the vacuum processing apparatus of FIG. 1.

FIG. 2 presents a schematic cross sectional view to show a configuration in which the loader module LM is connected to the load lock chamber 14 of each load lock module $LLM_j$ (j=1, 2) via the door valve DV and the zonal airflow generating unit 20 and also show major components of the vacuum processing apparatus.

Each load lock module $LLM_j$ has therein a wafer mounting table 22 for mounting a wafer W thereon. Further, a lift pin mechanism (not shown) is installed in the mounting table 22, and it serves to move the wafer W upward and downward while maintaining it horizontally even when the wafer W is transferred between the transfer robots $RB_1$ and $RB_2$.

Further, a gas inlet port 24 is formed on an upper portion of the load lock chamber 14, e.g., a ceiling surface thereof. A gas supply line 28 from a purge gas supply source 26 is connected to the gas inlet port 24, and a flow rate control valve 30 and an opening/closing valve 32 are installed on the gas supply line 28 in parallel with each other. The opening/closing valve 32 is formed of, e.g., an air-operated valve and its opening/closing (on/off) operation is controlled by a controller 18. The flow rate control valve 30 is formed of, e.g., a proportional control valve, and its opening ratio is controlled by a pressure control unit 34. A vacuum gauge 36 for detecting an internal pressure of the load lock chamber 14 is installed at a ceiling portion of the load lock chamber 14, and an output signal (pressure measurement value) of the vacuum gauge 36 is sent to the pressure control unit 34 as a feedback signal.

For changing the internal pressure of the load lock chamber 14 from a depressurized level to an atmospheric level, the opening/closing valve 32 is opened, and a purge gas, e.g., a nitrogen gas, is supplied into the load lock chamber 14 from the purge gas supply source 26 via the opened opening/closing valve 32. Further, to maintain the vacuum pressure in the load lock chamber 14 at a constant value after changing its atmosphere into the depressurize state from the atmospheric state, the purge gas from the purge gas supply source 26 is supplied into the load lock chamber 14 via the flow rate control valve 30 as a pressure control gas with the opening/closing valve 32 remaining closed. Here, the opening ratio of the flow rate control valve 30 (i.e., the flow rate of the gas supplied) is feedback-controlled by the vacuum gauge 36 and the pressure control unit 34.

Also, a gas exhaust port 38 is provided in the bottom surface of the load lock chamber 14. The gas exhaust port 38 is connected to a vacuum pump 42 via a gas exhaust line 40, and the gas exhaust line 40 is provided with an opening/closing valve 44. The vacuum pump 42 has a low vacuum pump for an initial rough exhausting and a high vacuum pump operated at a high vacuum level. The opening/closing valve 44 is formed of, e.g., an air-operated valve and its opening/closing (of/off) operation is controlled by the controller 18.

The door valve DV is attached to the load lock chamber 14 in such a manner as to partition an atmospheric side loading/unloading port 14a of the load lock chamber 14. The door valve DV is maintained closed in a normal state and is temporarily opened to allow the wafer W or the transfer arm of the atmospheric transfer robot $RB_2$ to pass therethrough. If the door valve DV is opened, the load lock chamber 14 and the atmospheric transfer chamber 16 of the loader module LM is allowed to be communicated with each other. The opening/closing operation of the door valve DV is controlled by the controller 18.

The zonal airflow generating unit 20 includes: a rectangular frame-shaped main body 46 installed between the door valve DV and the atmospheric transfer chamber 16 and provided with an opening or a transfer passageway 45 penetrating therethrough horizontally; an air blowing portion (or flat air nozzle or an air curtain) 48 provided at an upper portion of the main body 46; and an air suctioning portion 50 provided at a lower portion (located below the air blowing portion 48) of the main body 46. The transfer passageway 45 of the main body 46 may be formed to have an opening size identical with or larger than that of the door valve DV.

Figure 3:
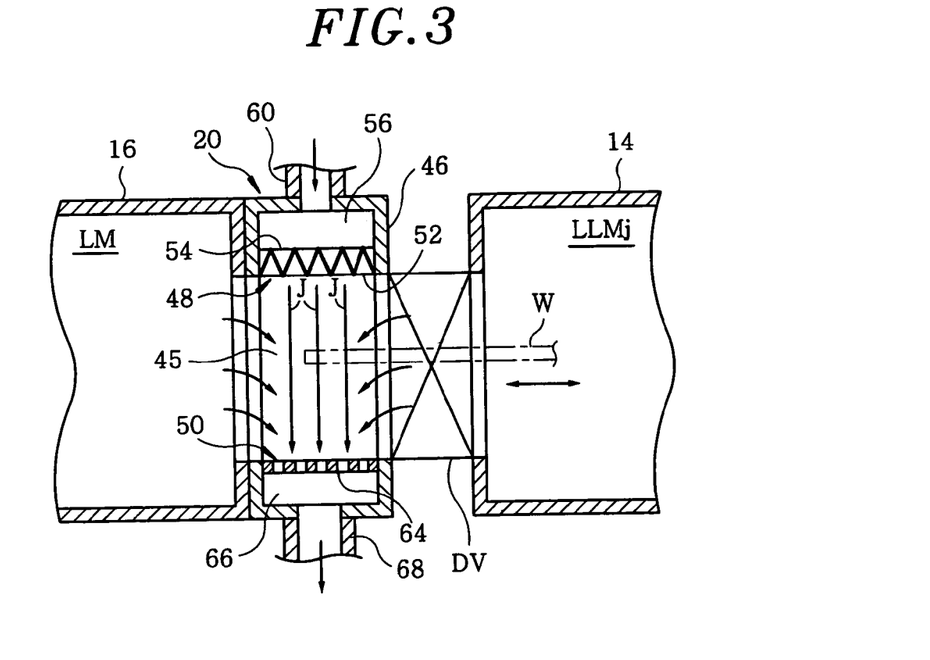
FIG. 3 presents a longitudinal cross sectional view showing major components of a zonal airflow generating unit in accordance with the first preferred embodiment of the present invention.

FIG. 3 illustrates a configuration of major components of the airflow generating unit 20 in accordance with the first preferred embodiment of the present invention. The air blowing portion 48 includes: an injection opening 52 of, e.g., a slit shape or a porous shape, provided at a position even with or higher than a top end of the passageway of the door valve DV; a filter 54 disposed inside (above) the injection opening 52; and a gas introduction chamber (buffer chamber) 56 provided inside (above) the filter 54. In this configuration, a high-pressure dry gas for the generation of airflows, e.g., air (or an inert gas such as a nitrogen gas), is introduced into the buffer chamber 56 from an exterior gas supply source 58 via a gas supply line 60, and, after passing through the filter 54, the gas is vertically blown downward into the transfer passageway 45 right below the injection opening 52 in a strip shape, e.g., a curtain shape (as illustrated in FIGS. 2 and 3). The filter 54 may be an ordinary filter capable of capturing particles whose diameters are larger than a certain value. Further, an opening/closing valve 62 is provided at the gas supply line 60 (see FIG. 2). The opening/closing valve 62 is formed of, e.g., an air-operated valve, and its opening/closing (on/off) operation is controlled by the controller 18.

Further, as shown in FIG. 3, the air suctioning portion 50 includes: a suction opening 64 of, e.g., a slit shape or a porous shape, provided at a position even with or lower than a bottom end of the passageway of the door valve DV; and a buffer chamber 66 provided inside (below) the suction opening 64. Further, a vacuum source 70 is connected to the buffer chamber 66 via a gas exhaust line 68, and the gas exhaust line 68 is provided with an opening/closing valve (see FIGS. 2 and 3). The vacuum source 70 is for supplying a vacuum force for the suction of a gas through the suction opening 64, and it may be formed of an ejector or a low vacuum pump with a high exhausting capacity. Also, the vacuum source 70 can be installed as the factory facility or installed in the vicinity of the apparatus. The opening/closing valve 72 is formed of, e.g., an air-operated valve, and its opening/closing (on/off) operation is controlled by the controller 18.

In the first preferred embodiment, when the air blowing portion 48 and the air suctioning portion 50 perform an air blowing operation and an air suctioning operation at the same time, zonal airflows J of dry air blown from the injection opening 52 of the air blowing portion 48 are vertically drawn downward by a vacuum force generated at the air suctioning portion 50 and finally reach the suction opening 64 provided at the bottom portion of the air suctioning portion 50, during which the zonal laminar airflows are maintained without suffering from a generation of turbulent flows on the way. Further, by increasing the vacuum force of the air suctioning portion 50, ambient gas, i.e., air from the loader module LM or air introduced from the load lock chamber 14 through the passageway of the door valve DV with the door valve DV opened, can also be drawn to the suction opening 64 to be exhausted through the gas exhaust line 68.

Figure 4:
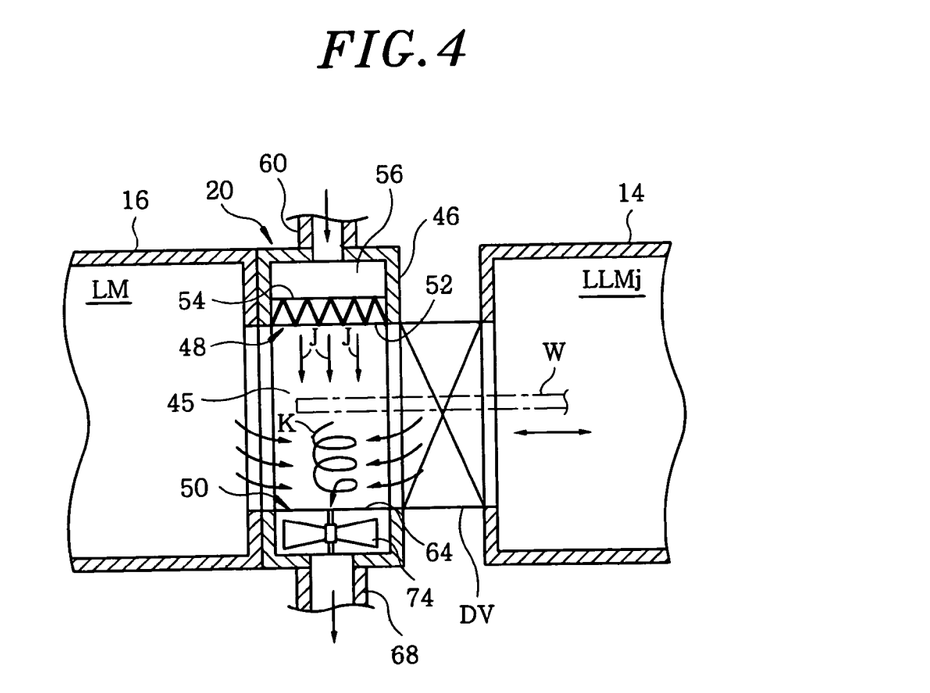
FIG. 4 provides a longitudinal cross sectional view showing major components of a zonal airflow generating unit in accordance with a second preferred embodiment of the present invention.
Figure 5:
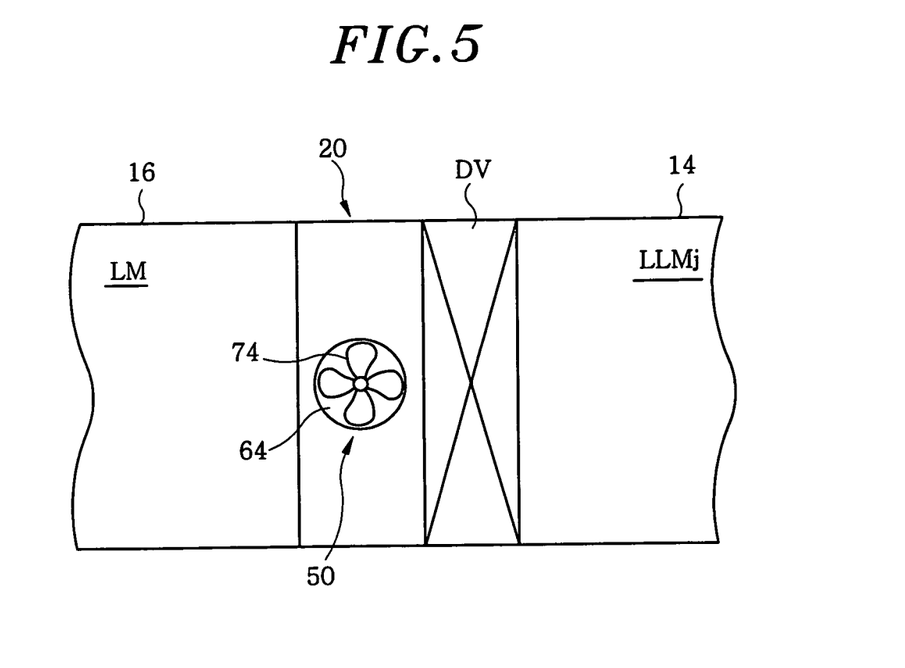
FIG. 5 offers a plane view showing a configuration of an airflow suctioning portion of the zonal airflow generating unit in accordance with the second preferred embodiment of the present invention.

FIGS. 4 and 5 illustrate major components of a zonal airflow generating unit 20 in accordance with a second preferred embodiment of the present invention. The characteristic of this preferred embodiment resides in the configuration where a suction opening 64 of an air suctioning portion 50 is preferably provided at a central portion of a bottom surface of the air suctioning portion 50 and an impeller 74 is rotatably installed inside (below) the suction opening 64. The impeller 74 is rotated by a wind force of, e.g., external air or dry air induced to the suction opening 64 by a vacuum force from a gas exhaust unit (including a gas exhaust line 68 and a vacuum source 70), thus generating suctioning airflows K of a vortex thereabove. The zonal laminar airflows J of the dry air blown downward from an air blowing portion 48 is converted into a vortex while passing through a transfer passageway 45 and vertically flows downward toward a suction opening 50 located below, while whirling up ambient gases together.

Referring back to FIG. 2, though not shown, the transfer module TM also has an exhausting unit or a purge gas supply unit for use in depressurizing a vacuum transfer chamber 10 to a preset vacuum level. Further, each process module $PM_i$ (i=1, 2, 3, 4) includes an exhausting unit for depressurizing a vacuum processing chamber 12 to a predetermined vacuum level, a processing gas supply unit for supplying a necessary processing gas into the vacuum processing chamber 12 according to a processing recipe.

The controller 18 is formed of single or plural micro processors, and it controls each component of a cluster tool. In particular, the controller 18 controls an opening/closing operation of a door valve DV, an on/off operation of the zonal airflow generating unit 20, a transfer operation of an atmospheric transfer robot $RB_2$, an opening/closing operation of a gate valve GB, a vertical movement of a lift pin in a load lock module $LLM_j$, a pressure changing operation in the load lock module $LLM_j$, and so forth.

Now, an operation of the zonal airflow generating unit 20 in accordance with the second preferred embodiment of the present invention will be described with reference to FIGS. 2 to 4. The description will be provided for the case of, for example, loading a single wafer W to be processed into a process module $PM_i$ from a loader module LM via a load lock module $LLM_j$ and a transfer module TM, and then returning the wafer W back into the loader module LM from the process module $PM_i$ via the transfer module TM and the load lock module $LLM_j$ after the wafer W has been processed.

As briefly mentioned above, the atmospheric transfer robot $RB_2$ of the loader module LM takes out a single to-be-processed wafer W from a wafer cassette CR on a load port LP, and transfers the wafer W to an orientation flat alignment mechanism ORT, where the wafer W is subject to an orientation flat alignment. Thereafter, the transfer robot $RB_2$ loads the wafer W into the load lock module $LLM_j$. Here, prior to loading the wafer W in the load lock chamber 14, a purge gas is supplied into the load lock module $LLM_j$ by opening an opening/closing valve 32, so that the interior of the load lock chamber 14 is maintained substantially in an atmospheric state (i.e., its internal pressure is maintained at an atmospheric pressure or a positive pressure). The door valve DV is timely opened when the transfer robot $RB_2$ accesses the load lock module $LLM_j$. Further, in relation to the on/off operation of the door valve DV, the zonal airflow generating unit 20 is turned on immediately before the door valve DV is opened. To turn the zonal airflow generating unit 20 on, the controller 18 turns on (opens) opening/closing valves 62 and 72 of an air blowing portion 48 and an air suctioning portion 50, respectively, at the same time.

Once the zonal airflow generating unit 20 is operated, there are generated zonal airflows flowing across a transfer passageway 45 between the air blowing portion 48 and the air suctioning portion 50, wherein the zonal airflows serve to block the transfer passageway 45. Here, the air suctioning portion 50 suctions almost entire dry air blown downward from the air blowing portion 48 while the door valve DV remains closed, and, at the same time, it also suctions some of the air in an atmospheric transfer chamber 16 of the loader module LM.

When the door valve DV is opened, the load lock chamber 14 and the atmospheric transfer chamber 16 of the loader module LM are made to communicate with each other through the passageway of the opened door valve DV and the transfer passageway 45 of the zonal airflow generating unit 20. Even when the door valve DV is opened, the airflow generating unit 20 maintains the same zonal airflows as before the door valve DV was opened. As a result, the air within the atmospheric transfer chamber 16 is blocked by the zonal airflows or suctioned by the air suctioning portion 50 on a bottom surface of the airflow generating unit 20 together with the dry air of the zonal airflows. Further, even if gas molecules (e.g., residual gas molecules) in the load lock chamber 14 diffuse out from the load lock chamber 14, they are blocked by the zonal airflows at the passageway of the opened door valve DV or suctioned into the suction opening 64 of the air suctioning portion 50 together with the dry air of the zonal airflow. Accordingly, gas molecules (in particular, residual gas molecules) in the load lock chamber 14 can be prevented from entering or diffusing to the atmospheric transfer chamber 16.

The transfer robot $RB_2$ of the loader module LM forwards a transfer arm for supporting the to-be-processed wafer W thereon through the passageway 45 of the zonal airflow generating unit 20 and the passageway of the opened door valve DV to finally insert the transfer arm into the load lock chamber 14. In the load lock chamber 14, the transfer robot $RB_2$ mounts the wafer W onto a lift pin (not shown) protruded from a mounting table 22, and then the transfer robot $RB_2$ retreats the empty transfer arm back through the same passageways as used to insert the transfer arm.

During the loading operation of the wafer W, the dry air blown downward from the air blowing portion 48 contacts the top surface of the wafer W when the wafer W passes through the passageway 45 of the zonal airflow generating unit 20, whereby particles and/or water molecules attached on the top surface of the wafer W can be blown off therefrom by the impact of the dry air contacting therewith. The particles and/or water molecules removed from the wafer W are induced to the air suctioning portion 50 located below while whirling around the outside surface of the wafer W together with the dry air or ambient gas (air from the atmospheric transfer chamber 16 or gas from the load lock chamber 14) to be finally suctioned through the suction opening 64. At this time, since a vacuum force from the air suctioning portion 50 reaches the bottom surface (backside surface) of the wafer W, particles and/or wafer molecules attached on the bottom surface of the wafer W can also be removed therefrom to be finally suctioned through the suction opening 64 located therebelow.

In particular, in the configuration where the impeller 74 is provided at the suction opening 64 as illustrated in FIG. 4, a whirl of a suctioning airflow K is generated below the wafer W while the wafer W is passing through the transfer passageway 45. As a result, the suction force for suctioning the particles and/or water molecules blown off from the wafer W is increased, further improving the effect of removing particles and/or water molecules from the backside surface of the wafer W.

The transfer arm of the transfer robot $RB_2$ is operated to pass through the transfer passageway 45 while infiltrating through the zonal airflows formed between the air blowing portion 48 and the air suctioning portion 50 of the zonal airflow generating unit 20. Therefore, as in the time of loading or unloading the wafer W, external air in the atmospheric transfer chamber 16 is prevented from entering the load lock chamber 14, and, also, air in the load lock chamber 14 is prevented from being drawn out into the atmospheric transfer chamber 16. Moreover, in case foreign substances such as particles and/or water molecules get attached on the transfer arm, they would be effectively removed by the downward flows of the zonal airflows J or the whirl of the suctioning airflows K.

After the transfer robot $RB_2$ loads the wafer W into the load lock module $LLM_1$ and then retreats the transfer arm as described above, the door valve DV is immediately closed, which, in turn, leads to the turning off of the zonal airflow generating unit 20. That is, the closing of the opening/closing valve 62 results in the air blowing operation of the air blowing portion 48 being stopped, the closing of the opening/closing valve 62 coinciding with the closing of the opening/closing valve 72, which, in turn, results in the air suctioning operation of the air suctioning portion 50 being stopped.

After the wafer W to be processed is loaded in the load lock chamber 14, the load lock module $LLM_j$ evacuates the load lock chamber 14. Then, once the internal pressure of the load lock chamber 14 reaches a preset vacuum level, a gate valve GB is opened, allowing a vacuum transfer robot $RB_1$ of the transfer module TM to take out the wafer W from the load lock chamber 14 into a vacuum transfer chamber 10. Thereafter, the gate valve GB is closed. Subsequently, when the vacuum transfer robot $RB_1$, accesses a target process module $PM_i$, a gate valve GA of the target process module $PM_i$ is opened in sync therewith. A transfer arm (e.g., $F_A$) of the vacuum transfer robot $RB_1$ loads the wafer W into a vacuum processing chamber 12 of the process module $PM_i$ through the opened gate valve GA and then retreats therethrough. Thereafter, the gate valve GA is closed.

The process module $PM_i$ performs a single-sheet process on the wafer W in the vacuum processing chamber 12 under a predetermined condition (gas, pressure, high-frequency power, time, etc.) according to a preset recipe.

After the single-sheet process is completed, the gate valve GA is opened, and the vacuum transfer robot $RB_1$ of the transfer module TM unloads the processed wafer W from the vacuum processing chamber 12. Subsequently, the gate valve GB on the side of the load lock module $LLM_j$ is opened, and the vacuum transfer robot $RB_1$ loads the processed wafer W into the load lock chamber 14. At this time, the internal pressure of the load lock chamber 14 is maintained at a preset vacuum level in a depressurized atmosphere.

Once the processed wafer W is loaded in the load lock chamber 14, the load lock module $LLM_j$ opens the opening/closing valve 32, allowing so that a purge gas to be supplied into the interior of the load lock chamber 14 from the purge gas supply source 26 at a high flow rate. Then, once the internal pressure of the load lock chamber 14 reaches an atmospheric pressure or a preset pressure level slightly higher than that (a positive pressure), the door valve DV is opened, and the transfer robot $RB_2$ of the loader module LM takes out the processed wafer W from the load lock chamber 14 and transports it into the atmospheric transfer chamber 16.

Here, immediately before the door valve DV is opened, the zonal airflow generating unit 20 is turned on. That is, the opening/closing valves 62 and 72 are opened so that the air blowing portion 48 and the air suctioning portion 50 perform an air blowing operation and an air suctioning operation, respectively, whereby zonal airflows are generated in the transfer passageway 45 in a manner that they block the transfer passageway 45 aerially. In this mechanism, the air in the atmospheric transfer chamber 16 is blocked by the zonal airflows of the dry air or suctioned into the airflow suctioning portion 50 located on the bottom of the zonal airflow generating unit 20 along with the zonal airflows of the dry air. Further, even if the gas molecules (for example, residual gas molecules) in the load lock chamber 14 escape out of the load lock chamber 14, the gas molecules would be blocked by the zonal airflows of the dry air or suctioned through the suction opening 64 of the air suctioning portion 50 along with the zonal airflows of the dry air immediately after it passes through the passageway of the door valve DV. Accordingly, the gas molecules (particularly, the residual gas molecules) in the load lock chamber 14 can be prevented from entering or diffusing to the atmospheric transfer chamber 16.

The transfer robot $RB_2$ moves an empty transfer arm forward through the passageway 45 of the zonal airflow generating unit 20 and the passageway of the opened door valve DV. Finally the transfer robot $RB_2$ inserts the transfer arm into the load lock chamber 14 to receive the processed wafer W from the lift pin (not shown) above the mounting table 22. Then, the transfer robot $RB_2$ retreats the transfer arm for supporting the wafer W thereon through the same passageways as used to insert the transfer arm.

During the wafer unloading operation as described above, the dry air blown downward from the air blowing portion 48 contacts the top surface of the wafer W when the wafer W passes through the transfer passageway 45 of the zonal airflow generating unit 20, whereby residual gas molecules attached on the top surface of the wafer W can be blown off therefrom by the impact of the dry air contacting therewith. The residual gas molecules blown off from the wafer W are induced to the air suctioning portion 50 located below while whirling around the outside surface (the vicinity) of the wafer W together with the dry air or ambient gases (air from the atmospheric transfer chamber 16 and/or gas molecules from the load lock chamber 14) to be finally suctioned through the suction opening 64. At this time, since a vacuum force from the air suctioning portion 50 reaches the bottom surface (backside surface) of the wafer W, the residual gas molecules attached on the bottom surface of the wafer W can also be removed to be finally suctioned through the suction opening 64 located right below. In particular, in the configuration where the impeller 74 is provided at the suction opening 64 as illustrated in FIG. 4, a whirl of the suctioning airflow K is generated below the wafer W while the wafer W is passing through the transfer passageway 45. As a result, the residual gas molecules can be removed from the bottom surface of the wafer W more effectively.

Figure 6:
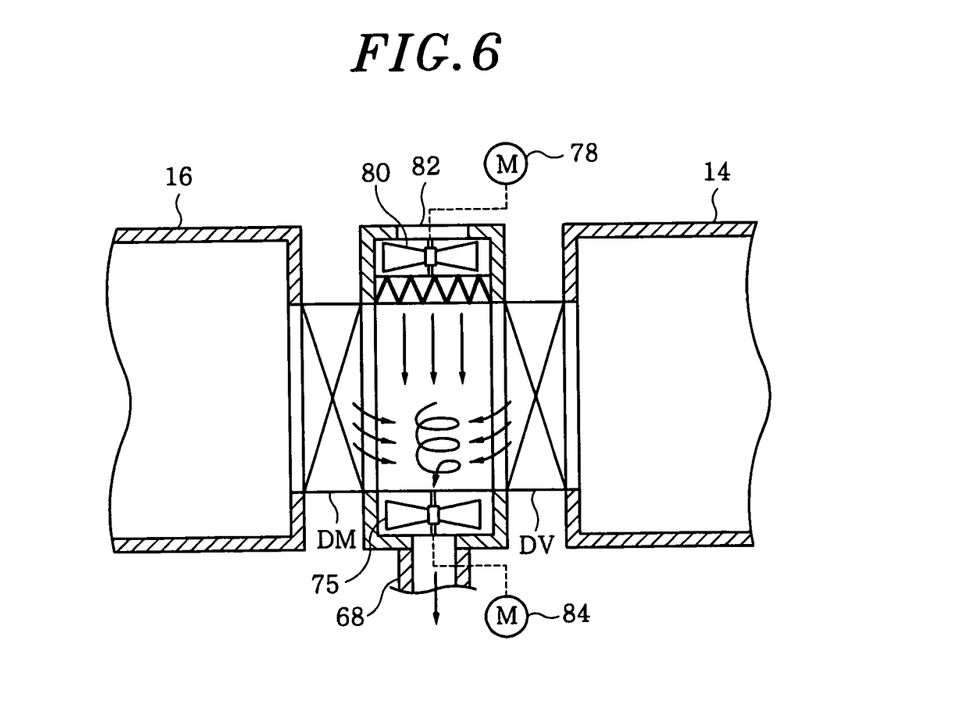
FIG. 6 depicts a longitudinal cross sectional view showing modifications of the zonal airflow generating units in accordance with the present invention.

FIG. 6 shows modifications of the zonal airflow generating unit 20 in accordance with the second embodiment of the present invention. In the figure, various modified examples are provided. A first modified example is that an electric blower 80 rotated by a driving force of an electric motor 78 is provided in the air blowing portion 48. In this configuration, external air is directly introduced into an input side of the electric blower 80 through an external air introduction port 82 formed in the top surface of the main body 46 of the zonal airflow generating unit 20 and the introduced external air is blown downwardly from an output side of the electric blower 80 through a filter 54. Though it is preferable to form the filter 54 with a chemical air filter capable of removing contaminants from air as well as fine particles therein, it can (also) be a high efficiency particular air (HEPA) filter, a middle-performance air filter, or the like. In this configuration, the gas supply source 58, the gas supply line 60 and the opening/closing valve 62 can be omitted.

In an air suctioning portion 50 in accordance with a second modified example, a rotary blade 75 is installed inside (below) the suction opening 64, and the rotary blade 75 is rotated by an electric motor 84. In this case, since the gas suctioned through the suction opening 64 can be sent into the gas exhaust line 68 by an exhausting operation of the rotary blade 75, the vacuum source 70 can be omitted.

To be more specific, a fixed blade (not shown) is installed to face the rotary blade 75 at a position inside the rotary blade 75, wherein a blade direction of the fixed blade is configured to be opposite to that of the rotary blade 75 to prevent a backflow of gas molecules. Further, the rotary blade 75 is set up such that it can be rotated by a magnetic levitation, making a rotary motion possible with an inertial force even when a supply of a driving power is stopped by a sudden stoppage of the motor 84, preventing a stay of the exhaust gas. Moreover, the rotary blade 75 can be rotated by several tens of thousands of rpm. It is also possible to carry out the exhaust of gas by rotating the rotary blade 75 at a rotational speed substantially identical to the velocity of molecules moving in the zonal airflow generating unit 20 under a preset pressure, thus setting up a situation in which the number of molecules escaping through an exhaust side is always larger than that of molecules escaping through a suction side.

Though not shown, it is also possible to arrange a plurality of rotary blades 75 in series. In such a case, the rotary blade 75 of each stage draws gas molecules toward the fixed blade thereof from a rotary blade 75 of a previous stage, to finally send the gas molecules from the fixed blade to a rotary blade 75 of a next stage. In such a bucket relay manner (bucket-brigade), the gas molecules are transferred through the plurality of rotary blades 75 to finally reach the exhaust side. By using the exhaust mechanism of this type, a certain gas exhaust rate can be realized and maintained regardless of the gas type.

In a third modified example shown in FIG. 6, an additional door valve DM is installed between the zonal airflow generating unit 20 and the atmospheric transfer chamber 16. Typically, the additional door valve DM is co-operated with the door valve DV on the side of the load lock chamber 14. With the employment of the additional door valve DM, the same effect as obtained through the use of the door valve DV can be acquired.

Moreover, as indicated by imaginary lines 90 in FIG. 2, it is preferable that a heater for heating air or an inert gas supplied to the air blowing portion 48 from the gas supply source 58 is installed, for example, on the gas supply line 60. With this configuration, by setting the temperature of the zonal airflows formed by the zonal airflow generating unit 20 to be higher than, e.g., a room temperature, the effect of removing foreign substances (particularly water molecules) from, e.g., the wafer can be further improved.

Here, it is to be noted that the present invention is not limited to the preferred embodiments described above. For example, the structure or shape of each component of the zonal airflow generating unit in accordance with the present invention is not limited to those illustrated in the preferred embodiments but can be changed in various ways. Further, the air blowing portion 48 and the air suctioning portion 50 installed completely separated from each other without having to use the main body 46 or they can be installed in an arbitrary atmospheric transfer passageway not limited to the vicinity of the door valve. Moreover, an object to be processed is not limited to a semiconductor wafer but can be various substrates for a flat panel display, a photo mask, a CD substrate, a printed substrate or the like.

While the invention has been shown and described with respect to the preferred embodiments, it will be understood by those skilled in the art that various changes and modifications may be made without departing from the scope of the invention as defined in the following claims.

What is claimed is:

1. A vacuum processing apparatus comprising:
   a vacuum processing chamber in which a predetermined processing is performed on a target object under a depressurized pressure;
   a load lock chamber configured such that an interior atmosphere of the load lock chamber is changed between a substantially atmospheric state and a depressurized state to perform a transfer of the target object between the vacuum processing chamber and a space in the atmospheric state;
   an atmospheric transfer chamber connected to the load lock chamber; and
   a zonal airflow generating unit provided between the load lock chamber and the atmospheric transfer chamber,
   wherein the zonal airflow generating unit includes:
      a frame-shaped main body positioned outside the atmospheric transfer chamber between the load lock chamber and the atmospheric transfer chamber, the main body having an opening which horizontally passes through the main body to form a passageway through which the target object is transferred between the atmospheric transfer chamber and the load lock chamber;
      an air blowing portion, provided at an upper portion of the main body and configured to blow a zonal laminar flow of air or inert gas vertically downward from a position substantially even with or higher than a top end of the passageway; and
      an air suctioning portion, provided at a lower portion of the main body and configured to suction, by vacuum force, the air or the inert gas from the air blowing portion at a position substantially even with or lower than a bottom end of the passageway,
   wherein the air suctioning portion includes:
      a suction opening; and
      an impeller rotatably installed at the suction opening, and
   wherein the impeller is configured to convert the zonal laminar airflow into a vortex so that the zonal laminar airflow converted into the vortex is vertically blown downward and into the air suctioning portion while pulling gas surrounding the vortex into the air suction opening.

2. The apparatus of claim 1, wherein the air blowing portion further has a heater which heats the air or the inert gas.

3. The apparatus of claim 1, further comprising: a door valve for opening or closing the passageway; and
   a controller which controls the air blowing portion and the air suctioning portion to start an air blowing operation and an air suctioning operation, respectively, immediately before the door valve is opened, and to stop their operations immediately after the door valve is closed.

4. The apparatus of claim 3, wherein the vacuum processing apparatus further comprises an additional door valve in the atmospheric transfer chamber and the zonal airflow generating unit is disposed between the door valve and the additional door valve.

5. The apparatus of claim 1, wherein the air suctioning portion suctions air in the atmospheric transfer chamber and gas in the load lock chamber as well as the zonal laminar flow from the air blowing unit converted into the vortex.

6. The apparatus of claim 5, wherein the zonal airflow generating unit blocks and suctions the air in the atmospheric transfer chamber, so that the air in the atmospheric transfer chamber is prevented from entering the load lock chamber.

7. The apparatus of claim 1, wherein the atmospheric transfer chamber includes load ports through which the target object is introduced into the atmospheric transfer chamber.

8. The apparatus of claim 1, wherein the vacuum processing apparatus further comprises an atmospheric transfer robot disposed in the atmospheric transfer chamber, the atmospheric transfer robot transferring the target object to the load lock chamber through the passageway.

9. A zonal airflow generating unit configured to be disposed between a load lock chamber and an atmospheric transfer chamber of a vacuum processing apparatus, comprising:
- a frame-shaped main body positioned outside the atmospheric transfer chamber between the load lock chamber and the atmospheric transfer chamber, the main body having a hole which horizontally passes through the main body to form a passageway through which a target object is transferred between the atmospheric transfer chamber and the load lock chamber;
- an air blowing portion, provided at an upper portion of the main body and configured to blow a zonal laminar flow of air or inert gas vertically downward from a position substantially even with or higher than a top end of the passageway; and
- an air suctioning portion, provided at a lower portion of the main body and configured to suction, by vacuum force, the air or the inert gas from the air blowing portion at a position substantially even with or lower than a bottom end of the passageway,
- wherein the air suctioning portion includes:
  - a suction opening; and
  - an impeller rotatably installed at the suction opening, and
- wherein the impeller is configured to convert the zonal laminar airflow into a vortex so that the zonal laminar airflow converted into the vortex is vertically blown downward and into the air suctioning portion while pulling gas surrounding the vortex into the air suction opening.

10. The zonal airflow generating unit of claim 9, wherein the air blowing portion further has a heater which heats the air or the inert gas.

11. The zonal airflow generating unit of claim 9, wherein the air suctioning portion suctions air in the atmospheric transfer chamber and gas in the load lock chamber as well as the zonal laminar flow from the air blowing unit converted into the vortex.

12. The zonal airflow generating unit of claim 11, wherein the zonal airflow generating unit blocks and suctions the air in the atmospheric transfer chamber, so that the air in the atmospheric transfer chamber is prevented from entering the load lock chamber.

13. The zonal airflow generating unit of claim 9, wherein the zonal airflow generating unit is disposed between a door valve of the load lock chamber and a door valve of the atmospheric transfer chamber and the passageway is formed through the zonal airflow generating unit and between the two door valves.

* * * * *